(12) United States Patent
Chen

(10) Patent No.: US 11,251,264 B2
(45) Date of Patent: Feb. 15, 2022

(54) SEMICONDUCTOR DEVICE AND MANUFACTURING METHOD OF THE SAME

(71) Applicant: Vanguard International Semiconductor Corporation, Hsinchu (TW)

(72) Inventor: Chih-Yen Chen, Tainan (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/596,066

(22) Filed: Oct. 8, 2019

(65) Prior Publication Data

US 2021/0104599 A1 Apr. 8, 2021

(51) Int. Cl.
*H01L 29/04* (2006.01)
*H01L 29/66* (2006.01)
*H01L 29/778* (2006.01)
*H01L 29/10* (2006.01)
*H01L 29/20* (2006.01)

(52) U.S. Cl.
CPC ...... *H01L 29/045* (2013.01); *H01L 29/66462* (2013.01); *H01L 29/7787* (2013.01)

(58) Field of Classification Search
CPC ....... H01L 21/18–326; H01L 21/02389; H01L 29/045; H01L 29/66462; H01L 29/7787; H01L 29/2003–207
See application file for complete search history.

(56) References Cited

U.S. PATENT DOCUMENTS

| 2002/0047113 A1 | 4/2002 | Ohno et al. |
| 2002/0167023 A1 | 11/2002 | Chavarkar et al. |
| 2009/0057684 A1 | 3/2009 | Otake et al. |
| 2012/0211801 A1* | 8/2012 | Hashimoto ......... H01L 29/7785 257/194 |
| 2014/0264369 A1* | 9/2014 | Padmanabhan ..... H01L 29/7787 257/76 |
| 2018/0182620 A1* | 6/2018 | Odnoblyudov ..... H01L 21/0242 |

OTHER PUBLICATIONS

Taiwanese Office Action and Search Report for Taiwanese Application No. 108125152, dated Jul. 17, 2020.
Taiwanese Office Action and Search Report for Taiwanese Application No. 108125152, dated Dec. 8, 2021.

* cited by examiner

*Primary Examiner* — Herve-Louis Y Assouman
(74) *Attorney, Agent, or Firm* — Birch, Stewart, Kolasch & Birch, LLP

(57) ABSTRACT

A semiconductor device includes a substrate and a first III-V compound layer disposed on the substrate. The first III-V compound layer includes a plurality of crystal lattices, each of which has a prism plane. The semiconductor device further includes a second III-V compound layer disposed on the first III-V compound layer. The semiconductor device includes a source electrode, a drain electrode and a gate electrode disposed on the second III-V compound layer. The source electrode and the drain electrode define a channel region that has a plurality of channels of charge carriers in the first III-V compound layer. The normal direction of the prism plane defines an m-axis, and each of the channels of the charge carriers is parallel with the m-axis.

18 Claims, 6 Drawing Sheets

SEMICONDUCTOR DEVICE AND MANUFACTURING METHOD OF THE SAME

BACKGROUND

Technical Field

Embodiments of the present disclosure relate to a semiconductor device, and in particular they relate to a semiconductor device that is used to form high electron mobility transistor (HEMT) elements, and a manufacturing method of the same.

Description of the Related Art

In the semiconductor industry, gallium nitride (GaN) is usually used to form various integrated circuit components, such as high electron mobility transistor (HEMT) elements, due to its characteristics. The high electron mobility transistor (HEMT) is also known as a heterostructure field-effect transistor (HFET) or a modulation-doped field-effect transistor (MODFET), which is made of semiconductor materials having different energy gaps. A two-dimensional electron gas (2DEG) layer is formed at the interface between two different semiconductor materials that are adjacent to each other. Due to the high electron mobility of the 2DEG, the HEMT can have high breakdown voltage, high electron mobility, low on-resistance, low input capacitance, and other advantages, and is therefore suitable for high-power components.

However, while existing HEMTs generally meet requirements, they are not satisfactory in every respect, and further improvements are needed to improve performance and have wider application.

SUMMARY

Some embodiments of the present disclosure include a semiconductor device. The semiconductor device includes a substrate and a first III-V compound layer disposed on the substrate. The first III-V compound layer includes a plurality of crystal lattices, each of which has a prism plane. The semiconductor device further includes a second III-V compound layer disposed on the first III-V compound layer. The semiconductor device includes a source electrode, a drain electrode and a gate electrode disposed on the second III-V compound layer. The source electrode and the drain electrode define a channel region that has a plurality of channels of charge carriers in the first III-V compound layer. The normal direction of the prism plane defines an m-axis, and each of the channels of the charge carriers is parallel with the m-axis.

Some embodiments of the present disclosure include a semiconductor device. The semiconductor device includes a substrate and a first III-V compound layer disposed on the substrate. The first III-V compound layer includes a plurality of crystal lattices, each of which has a prism plane. The semiconductor device further includes a second III-V compound layer disposed on the first III-V compound layer. The semiconductor device includes a source electrode, a drain electrode and a gate electrode disposed on the second III-V compound layer. The source electrode and the drain electrode define a channel region that has a plurality of channels of charge carriers in the first III-V compound layer. Each of the channels of the charge carriers is parallel with the normal direction of the m-plane.

Some embodiments of the present disclosure include a manufacturing method of a semiconductor device. The manufacturing method of the semiconductor device includes forming and providing a substrate. The manufacturing method of the semiconductor device further includes forming a first III-V compound layer on the substrate. The first III-V compound layer includes a plurality of crystal lattices, each of which has a prism plane. The manufacturing method of the semiconductor device includes forming a second III-V compound layer on the first III-V compound layer. The manufacturing method of the semiconductor device further includes forming a source electrode, a drain electrode and a gate electrode on the second III-V compound layer. The source electrode and the drain electrode define a channel region that has a plurality of channels of charge carriers in the first III-V compound layer. The normal direction of the prism plane defines an m-axis, and each of the channels of the charge carriers is parallel with the m-axis.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 to FIG. 4 are a series of partial cross-sectional views illustrating a method for forming a semiconductor device according to an embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

One of the important factors affecting the power consumption of a semiconductor device is its on-resistance ($R_{on}$), which is proportional to the power consumption of the semiconductor device. Embodiments of the present disclosure provide a semiconductor device and a manufacturing method of the same, which particularly are used to form high electron mobility transistor (HEMT) elements. In the embodiments of the present disclosure, the on-resistance of the semiconductor device may be effectively reduced by arranging the channel of the charge carriers in a specific direction with respect to the crystal lattice of a III-V compound layer (e.g., gallium nitride (GaN)). The following description will be made with reference to the embodiments shown in the drawings.

FIG. 1 to FIG. 4 are a series of partial cross-sectional views illustrating a method for forming a semiconductor device 1 according to an embodiment of the present disclosure. It should be noted that some components may be omitted in FIG. 1 to FIG. 4 in order to more clearly show the features of the embodiment of the present disclosure.

Referring to FIG. 1, a substrate 10 is provided. In some embodiments, the substrate may be a semiconductor substrate, such as a silicon substrate, a silicon germanium (SiGe) substrate, a gallium arsenide (GaAs) substrate, or the like. In some embodiments, the substrate 10 may be a semiconductor-on-insulator substrate, such as a silicon-on-insulator (SOI) substrate. In some embodiments, the substrate 10 may be a glass substrate or a ceramic substrate, such as a silicon carbide (SiC) substrate, an aluminum nitride (AlN) substrate, or a sapphire substrate. However, the present disclosure is not limited thereto.

In some embodiments, the substrate 10 is a QST™ substrate. Here, the QST™ substrate refers to a substrate produced by Qromis Technology, Inc., USA. For example, the QST™ substrate may include a core, a barrier layer, a bonding layer and a single crystalline layer. In some embodiments, the barrier layer may encapsulate the core, the bonding layer may be disposed on the barrier layer, and the single crystalline layer may be disposed on the bonding layer, but the present disclosure is not limited thereto.

In some embodiments, the material of the core may include polycrystalline ceramic material, such as polycrystalline aluminium nitride (AlN), polycrystalline gallium nitride (GaN), polycrystalline aluminium gallium nitride (AlGaN), polycrystalline silicon carbide (SiC), polycrystalline zinc oxide (ZnO), polycrystalline gallium(III) trioxide ($Ga_2O_3$), any other applicable material or a combination thereof, but the present disclosure is not limited thereto. In some embodiments, the polycrystalline ceramic material may include a bonding material, such as yttrium oxide (i.e., yttria).

In some embodiments, the material of the barrier layer may be an amorphous material, such as silicon nitride ($Si_3N_4$), silicon carbonitride (SiCN), silicon oxynitride (SiON), aluminum nitride (AlN), silicon carbide (SiC), any other applicable material or a combination thereof, but the present disclosure is not limited thereto. In some embodiments, the barrier layer may be formed by a low-pressure chemical vapor deposition (LPCVD) process, but the present disclosure is not limited thereto. In some embodiments, the barrier layer may be a single-layer or multi-layer structure, which includes one or more materials laminated in a composite manner, but the present disclosure is not limited thereto.

In some embodiments, the barrier layer may be used to prevent diffusion or release of the components in the core (e.g., yttrium oxide, oxygen, metallic impurities, other trace elements, etc.) into the environment of the semiconductor processing chamber. In the semiconductor processing chamber, the QST™ substrate may be epitaxially grown, for example, at high temperatures (e.g., 1,000° C.).

In some embodiments, the material of the bonding layer may include silicon oxide, silicon nitride, silicon oxynitride, any other applicable material or a combination thereof, but the present disclosure is not limited thereto. In some embodiments, the bonding layer may be formed on the (partial) top surface of the barrier layer by chemical vapor deposition (CVD), atomic layer deposition (ALD) or spin-on coating, but the present disclosure is not limited thereto. For example, the chemical vapor deposition may include low-pressure chemical vapor deposition (LPCVD), low temperature chemical vapor deposition (LTCVD), rapid thermal chemical vapor deposition (RTCVD) or plasma enhanced chemical vapor deposition (PECVD).

In some embodiments, the material of the single crystalline layer may include silicon (Si), aluminum nitride (AlN), gallium nitride (GaN), aluminium gallium nitride (AlGaN), silicon carbide (SiC), any other applicable material or a combination thereof, but the present disclosure is not limited thereto. The single crystalline layer may be a single-layer or multi-layer structure. In some embodiments, the single crystalline layer may be formed by an epitaxial growth process, such as metal organic chemical vapor deposition (MOCVD), hydride vapor phase epitaxy (HVPE), molecular beam epitaxy (MBE), any other applicable process or a combination thereof, but the present disclosure is not limited thereto.

In some embodiments, the substrate 10 may further include a plurality of adhesion layers and a conductive layer.

The adhesion layers and the conductive layer may be disposed between the core and the barrier layer. For example, one of the adhesion layers may be disposed between the core and the conductive layer, and another of the adhesion layers may be disposed between the conductive layer and the barrier layer, but the present disclosure is not limited thereto.

In some embodiments, the material of each of the adhesion layers may include tetraethyl orthosiliate (TEOS), silicon oxide ($Si_xO_y$), any other applicable material or a combination thereof, but the present disclosure is not limited thereto. In some embodiments, the adhesion layer may be formed around the core by chemical vapor deposition (CVD), atomic layer deposition (ALD) or spin-on coating, but the present disclosure is not limited thereto.

In some embodiments, the conductive layer may include a highly conductive material that is doped (e.g., doped boron). In some embodiments, the doping concentration may be between $1\times10^{19}$ $cm^{-3}$ and $1\times10^2$ $cm^{-3}$ to provide high conductivity. Other dopants having different doping concentrations (e.g., phosphorus, arsenic, bismuth, etc. with a doping concentration between $1\times10^{16}$ $cm^{-3}$ and $5\times10^{18}$ $cm^{-3}$) may also be used to provide n-type or p-type semiconductor materials suitable for use in the conductive layer.

The detailed structure of the QST™ substrate may be referred to U.S. patent application Ser. No. 15/621,335, filed on Jun. 13, 2017, and U.S. patent application Ser. No. 15/621,235, filed on Jun. 13, 2017, which will not be repeated here. However, the present disclosure is not limited thereto.

Figure 2:

Referring to FIG. 2, a first III-V compound layer 20 is formed on the substrate 10. In some embodiments, the material of the first III-V compound layer 20 may include one or more III-V compound semiconductor materials, such as group III nitride. In some embodiments, the material of the first III-V compound layer 20 may include gallium nitride (GaN), aluminium gallium nitride (AlGaN), indium gallium nitride (InGaN), indium gallium aluminium nitride (InGaAlN), any other applicable material or a combination thereof. In some embodiments, the thickness of the first III-V compound layer 20 may be in a range from about 0.01 μm to about 10 μm. In some embodiments, the first III-V compound layer 20 may be doped, such as with an n-type or a p-type dopant. In some embodiments, the first III-V compound layer 20 may be formed by an epitaxial growth process, such as metal organic chemical vapor deposition (MOCVD), hydride vapor phase epitaxy (HVPE), molecular beam epitaxy (MBE), any other applicable process or a combination thereof, but the present disclosure is not limited thereto. For example, the first III-V compound layer 20 may be epitaxially grown by metal organic vapor phase epitaxy (MOVPE) using gallium-containing precursor and nitrogen-containing precursor. The gallium-containing precursor may include trimethylgallium (TMG), triethylgallium (TEG), or other suitable chemicals. The nitrogen-containing precursor may include ammonia ($NH_3$), tertiarybutylamine (TBAm), phenyl hydrazine, or other suitable chemicals. However, the present disclosure is not limited thereto.

Figure 3:
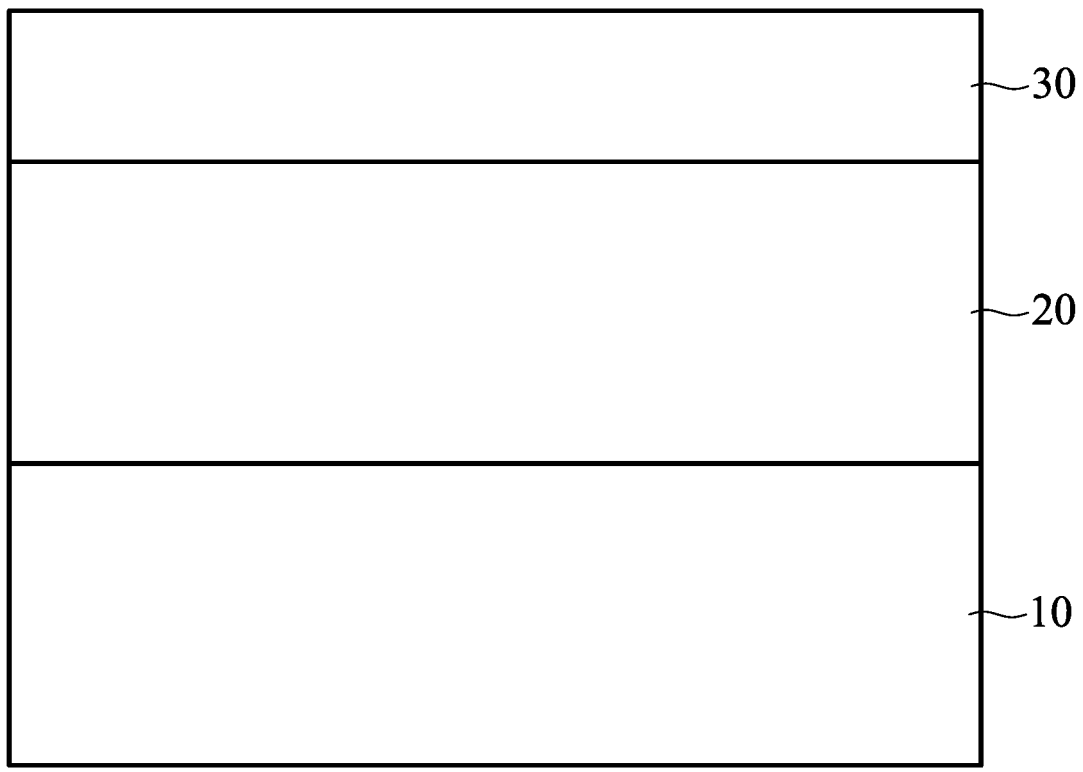

Referring to FIG. 3, a second III-V compound layer 30 is formed on the first III-V compound layer 20. In some embodiments, the material of the second III-V compound layer 30 may include one or more III-V compound semiconductor materials, such as group III nitride. In some embodiments, the material of the second III-V compound layer 30 may include aluminium gallium nitride (AlGaN), aluminium indium nitride (AlInN), indium gallium aluminium nitride (InGaAlN), any other applicable material or a combination thereof. In some embodiments, the thickness of the second III-V compound layer 30 may be in a range from about 1 nm to about 500 nm. In some embodiments, the second III-V compound layer 30 may be doped, such as with an n-type or a p-type dopant. In some embodiments, the second III-V compound layer 30 may be formed by an epitaxial growth process, such as metal organic chemical vapor deposition (MOCVD), hydride vapor phase epitaxy (HVPE), molecular beam epitaxy (MBE), any other applicable process or a combination thereof, but the present disclosure is not limited thereto. For example, the second III-V compound layer 30 may be epitaxially grown by metal organic vapor phase epitaxy (MOVPE) using aluminum-containing precursor, gallium-containing precursor, and nitrogen-containing precursor. The aluminum-containing precursor may include trimethylaluminum (TMA), triethylaluminum (TEA), or other suitable chemicals. The gallium-containing precursor may include trimethylgallium (TMG), triethylgallium (TEG), or other suitable chemicals. The nitrogen-containing precursor may include ammonia ($NH_3$), tert-butylamine (TBAm), phenyl hydrazine, or other suitable chemicals.

Figure 4:
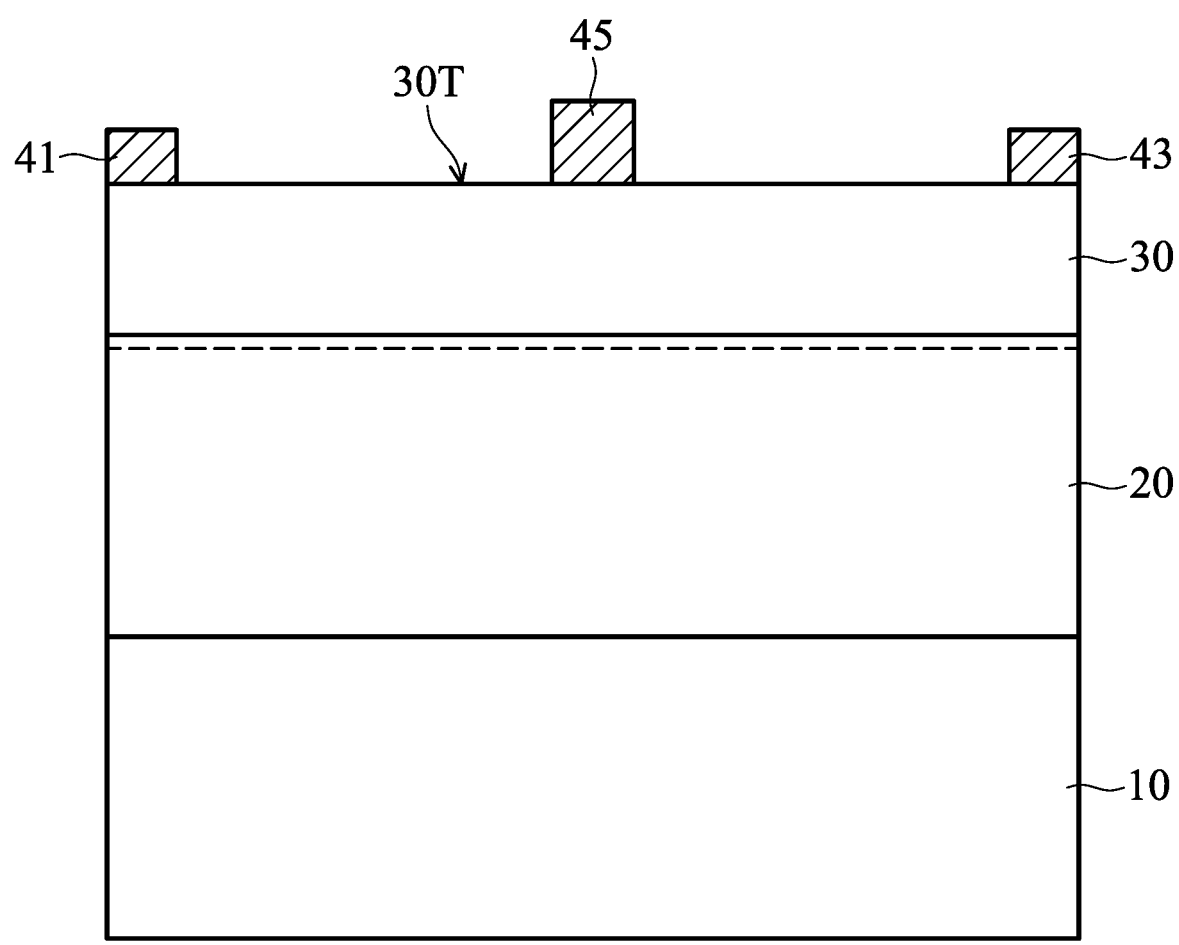

Referring to FIG. 4, a source electrode 41, a drain electrode 43 and a gate electrode 45 are formed on the second III-V compound layer 30 to form the semiconductor device 1. In the embodiments of the present disclosure, the source electrode 41, the drain electrode 43 and the gate electrode 45 may be arranged in a specific manner, which will be described in detail later with reference to the drawings.

In some embodiments, the material of the source electrode 41 may include a conductive material, such as a metal material, a metal silicide, a semiconductor material, any other applicable material or a combination thereof. The metal material may be gold (Au), nickel (Ni), platinum (Pt), palladium (Pd), iridium (Ir), titanium (Ti), chromium (Cr), tungsten (W), aluminum (Al), copper (Cu), a combination thereof, an alloy thereof or multilayers thereof. The semiconductor material may be a polysilicon or a poly-germanium. However, the present disclosure is not limited thereto. In some embodiments, the material of the drain electrode 43 may be the same as or similar to the material of the source electrode 41, which will not be repeated here.

The steps of forming the source electrode 41 and the drain electrode 43 may include depositing a conductive material (not shown) on the second III-V compound layer 30 and performing a patterning process on the conductive material to form the source electrode 41 and the drain electrode 43 on the top surface 30T of the second III-V compound layer 30. The deposition process for forming the conductive material may include atomic layer deposition (ALD), chemical vapor deposition (CVD), physical vapor deposition (PVD) (e.g., sputtering), any other applicable process or a combination thereof. It should be noted that the source electrode 41 and the drain electrode 43 are formed on the top surface 30T of the second III-V compound layer 30, but the present disclosure is not limited thereto. In some embodiments, portions of the source electrode 41 and portions of the drain electrode 43 may be formed in the second III-V compound layer 30 or may be connected to the first III-V compound layer 20, which may be adjusted according to actual demands.

In some embodiments, the material of the gate electrode 45 may include a conductive material, such as a metal material, a metal silicide, a semiconductor material, any other applicable material or a combination thereof. The metal material may be gold (Au), nickel (Ni), platinum (Pt), palladium (Pd), iridium (Ir), titanium (Ti), chromium (Cr), tungsten (W), aluminum (Al), copper (Cu), a combination thereof, an alloy thereof or multilayers thereof. The semiconductor material may be a polysilicon or a poly-germanium. However, the present disclosure is not limited thereto.

The steps of forming the gate electrode 45 may include depositing a conductive material (not shown) on the second III-V compound layer 30 and performing a patterning process on the conductive material to form the gate electrode 45 on the top surface 30T of the second III-V compound layer 30. The deposition process for forming the conductive material may include atomic layer deposition (ALD), chemical vapor deposition (CVD), physical vapor deposition (PVD) (e.g., sputtering), any other applicable process or a combination thereof.

In some embodiments, the semiconductor device 1 may further include a doped-compound semiconductor layer (not shown) that may be formed between the second III-V compound layer 30 and the gate electrode 45. In some embodiments, the doped-compound semiconductor layer may include a p-type doped III-V compound, such as a p-type doped gallium nitride. The p-type doped gallium nitride may be doped with at least one of magnesium (Mg), calcium (Ca), zinc (Zn), beryllium (Be), and carbon (C) and may be further added with other dopants selected from, for example, a group consisting of strontium (Sr), barium (Ba), and radium (Ra), but the present disclosure is not limited thereto. In some embodiments, the p-type doped-compound semiconductor layer may be formed by a metal organic chemical vapor deposition process (MOCVD) or other suitable deposition processes, a photolithography patterning process, and an etching process. In some embodiments, the p-type doped-compound semiconductor layer may have a thickness ranging between about 1 nm and about 100 nm.

Referring to FIG. 4, the band gap discontinuity and the piezo-electric effect between the first III-V compound layer 20 and the second III-V compound layer 30 create a carrier channel with highly mobile conducting electrons around the first III-V compound layer 20 and the second III-V compound layer 30. The carrier channel is referred to as a two-dimensional electron gas (2DEG) as shown by the dotted line in FIG. 4. The semiconductor device 1 shown in FIG. 4 may be a high electron mobility transistor (HEMT) using the two-dimensional electron gas (2DEG) as the conductive carrier.

Figure 5A:
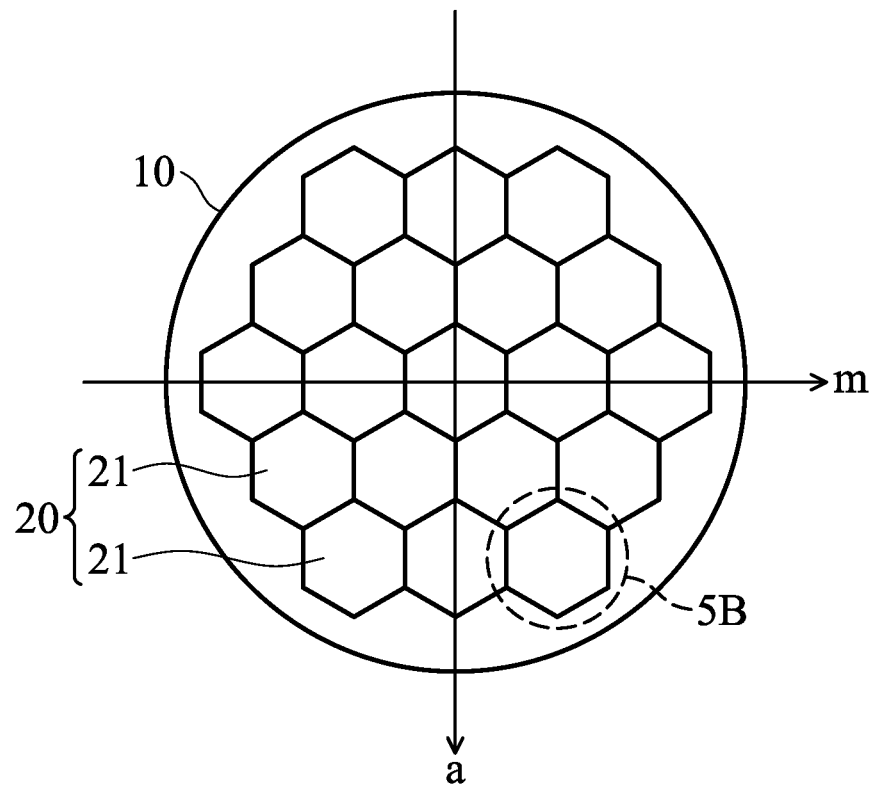
FIG. 5A is a partial top view illustrating the substrate and the first III-V compound layer.
Figure 5B:
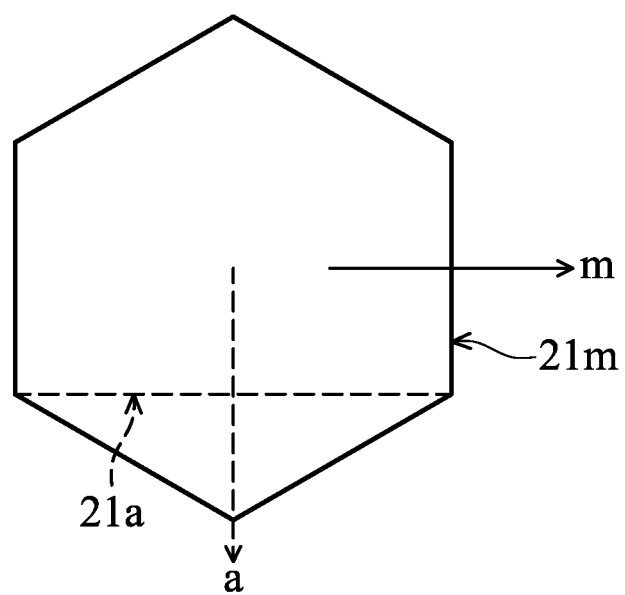
FIG. 5B is an enlargement of a single crystal lattice.
Figure 6:
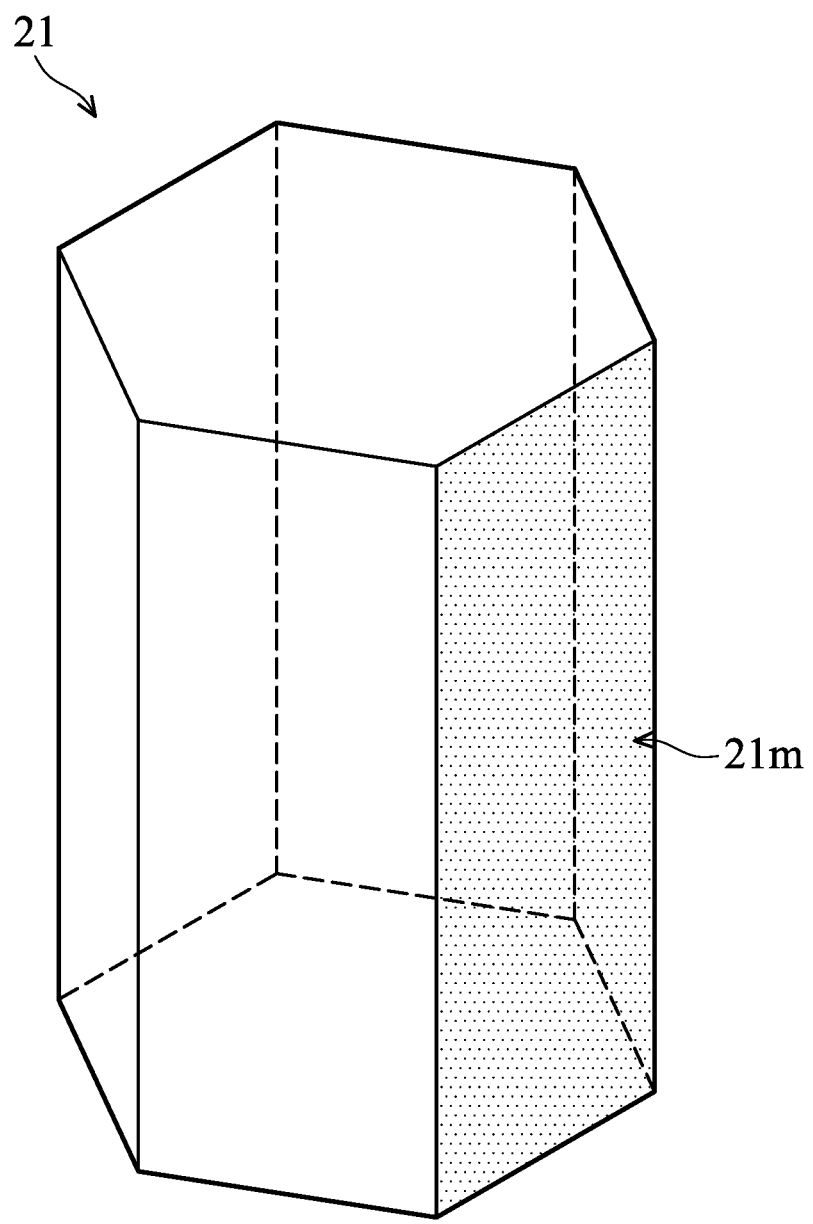
FIG. 6 is a three-dimensional view of the single crystal lattice.
Figure 7:
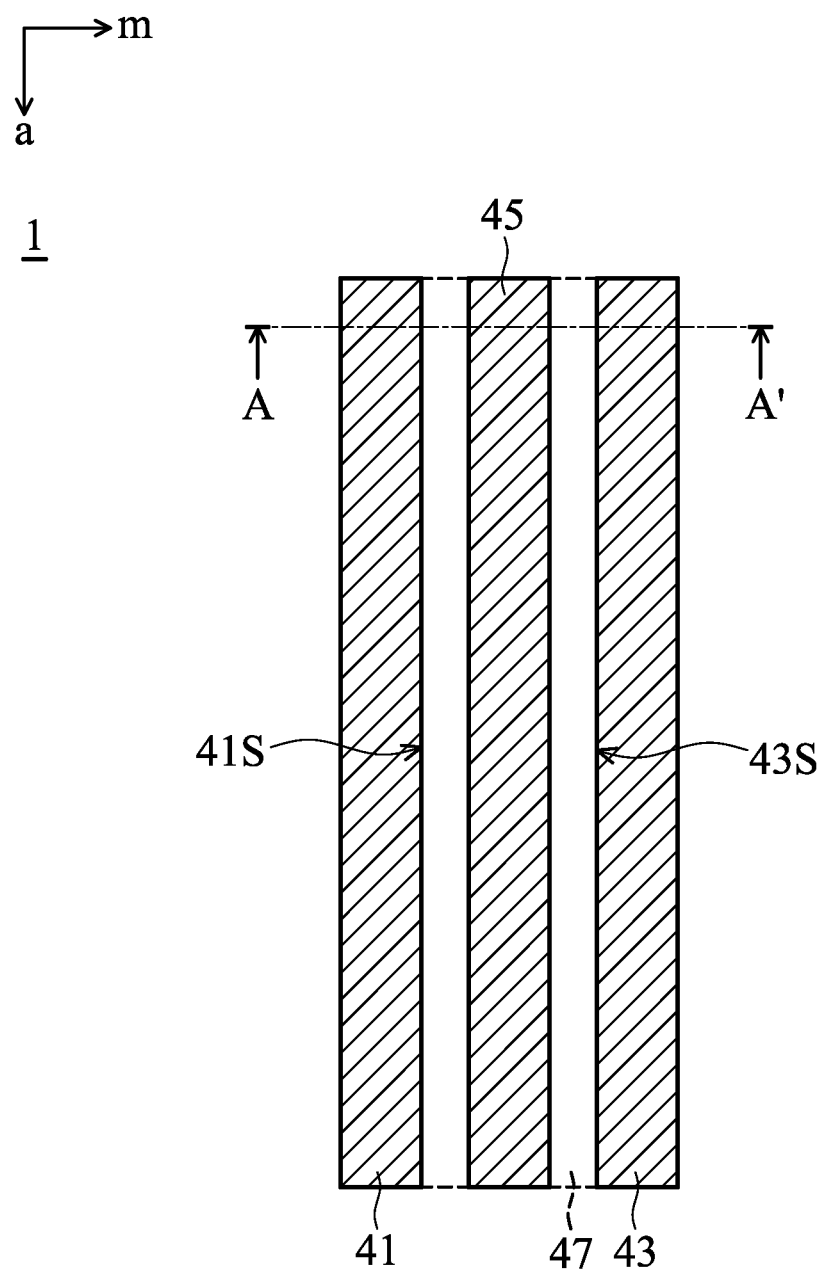
FIG. 7 is a partial top view illustrating the semiconductor device according to one embodiment of the present disclosure.

FIG. 5A is a partial top view illustrating the substrate 10 and the first III-V compound layer 20. In FIG. 5A, the first III-V compound layer 20 is presented in an arrangement of a plurality of crystal lattices 21, but the size of each of the crystal lattices 21 shown in FIG. 5A is merely illustrative, and the actual size of the crystal lattice 21 relative to the substrate 10 is not as shown in FIG. 5A. In the embodiment shown in FIG. 5A, the material of the first III-V compound layer 20 is described as gallium nitride (GaN), and the crystal lattice 21 of gallium nitride belongs to the hexagonal crystal system. FIG. 5B is an enlargement of a single crystal lattice 21. FIG. 6 is a three-dimensional view of the single crystal lattice 21. FIG. 7 is a partial top view illustrating the semiconductor device 1 according to one embodiment of the present disclosure.

It should be noted that some components may be omitted in FIG. 5A to FIG. 7 in order to more clearly show the features of the embodiment of the present disclosure. For example, FIG. 7 merely shows the source electrode 41, the drain electrode 43, the gate electrode 45 and a channel region 47 that is defined by the source electrode 41 and the drain electrode 43. Moreover, FIG. 4 may be, for example, a cross-sectional view along line A-A' of FIG. 7, but the present disclosure is not limited thereto.

Referring to FIG. 5A, FIG. 5B and FIG. 6, the crystal lattice 21 has a prism plane. In this embodiment, the prism plane refers to the rectangular plane on the side of the hexagonal column of the crystal lattice 21 of the hexagonal crystal system. That is, the prism plane refers to the m-plane 21m of the crystal lattice 21, which may be understood by those having ordinary knowledge in the technical field of the art. The prism plane (m-plane 21m) belongs to plane family {1-100}. For example, the prism plane (m-plane 21m) may be expressed as plane (10-10), but the present disclosure is not limited thereto. In other embodiments, the prism plane (m-plane 21m) may be expressed as plane (−1010), plane (1-100), plane (−1100), plane (01-10) or plane (0-110).

As shown in FIG. 5A and FIG. 5B, the normal direction of the prism plane may define an m-axis (i.e., label m shown in FIG. 5A and FIG. 5B). For example, when the prism plane is plane (10-10), the m-axis is [10-10]; when the prism plane is plane (−1010), the m-axis is [−1010]; when the prism plane is plane (1-100), the m-axis is [1-100]; when the prism plane is plane (−1100), the m-axis is [−1100]; when the prism plane is plane (01-10), the m-axis is [01-10]; when the prism plane is plane (0-110), the m-axis is [0-110].

Referring to FIG. 5A and FIG. 7, the source electrode 41 and the drain electrode 43 may define a channel region 47 that has a plurality of channels of charge carriers in the first III-V compound layer 20. In the embodiments of the present disclosure, each of the channels of the charge carriers is parallel with the m-axis. In other words, each of the channels of the charge carriers is parallel with the normal direction of the m-plane 21m.

In some embodiments, the extending direction of the source electrode 41 and the extending direction of the drain electrode 43 may be perpendicular to the m-axis (i.e., perpendicular to the normal direction of the m-plane 21m). That is, the source electrode 41 and the drain electrode 43 extend along the a-axis (label a) shown in FIG. 5A and FIG. 7. In some embodiments, the source electrode 41 and the drain electrode 43 are separated from each other in the direction of the m-axis (the normal direction of the m-plane 21m). In more detail, in some embodiments as shown in FIG. 7, the source electrode 41 and the drain electrode 43 are opposite and parallel with each other, the projection of the side wall of the source electrode 41 facing the drain electrode 43 on the substrate 10 is a side 41S, and the side 41S is perpendicular to the m-axis (perpendicular to the normal direction of the m-plane 21m); or the projection of the side wall of the drain electrode 43 facing the source electrode 41 on the substrate 10 is a side 43S, and the side 43S is perpendicular to the m-axis (perpendicular to the normal direction of the m-plane 21m).

In the embodiments of the present disclosure, the carrier (electron or hole) moving in the channel region 47 defined by the source electrode 41 and the gate electrode 43 may have a higher carrier mobility than a conventional semiconductor device, which may have a favorable influence on the on-resistance ($R_{on}$) of the semiconductor device 1.

It should be noted that the arrangement of the source electrode 41, the drain electrode 43 and the gate electrode 45 is not limited to the embodiment shown in FIG. 7. As long as each carrier channel in the channel region 47 is parallel to the m-axis, the carrier moving in the channel region 47 defined by the source electrode 41 and the drain electrode 43 may have a higher carrier mobility.

Table 1 shows the performance comparison results of the semiconductor device 1 according to the embodiment of the present disclosure and the semiconductor device of a comparative example. The structure of the semiconductor device 1 according to the embodiment of the present disclosure may be referred to FIG. 4 to FIG. 7, and each of carrier channels in the channel region 47 of the semiconductor device 1 according to the embodiment of the present disclosure is parallel to the m-axis (e.g., [10-10]). The semiconductor device of the comparative example has a structure similar to that of the semiconductor device 1 according to the embodiment of the present disclosure, except that each of the carrier channels in the channel region of the semiconductor device of the comparative example is parallel to the a-axis (i.e., the normal direction of the a-plane 21a of the crystal lattice 21, such as [11-20]) (referring to FIG. 5A and FIG. 5B).

TABLE 1

| performance | embodiment | comparative example |
|---|---|---|
| $R_{on}$ (m$\Omega$) | 20.5 | 115 |
| area (mm2) | 10.38 | 5.18 |
| $R_{on,sp}$ (m$\Omega$) | 2.13 | 5.96 |

In Table 1, $R_{on}$ is the on-resistance and $R_{on,sp}$ is the specific on-resistance. The specific on-resistance $R_{on,sp}$ is defined as the on-resistance distributed per square unit. As shown in Table 1, the specific on-resistance $R_{on,sp}$ of the semiconductor device 1 according to the embodiment of the present disclosure is reduced by 64% compared with the specific on-resistance $R_{on,sp}$ of the semiconductor device of the comparative example. That is, the on-resistance of the semiconductor device 1 may be effectively reduced by arranging each of carrier channels in a specific direction with respect to the crystal lattice 21 of the first III-V compound layer 20 (GaN).

As such, in the embodiments of the present disclosure, the on-resistance of the semiconductor device may be effectively reduced by arranging each of the carrier channels in the channel region of the semiconductor device to be parallel to the m-axis (i.e., the normal direction of the prism plane of the crystal lattice forming the first III-V compound layer).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising:
   a substrate;
   a first III-V compound layer disposed on the substrate, the first III-V compound layer comprising a plurality of crystal lattices, wherein each of the crystal lattices has a prism plane;
   a second III-V compound layer disposed on the first III-V compound layer; and
   a source electrode, a drain electrode and a gate electrode disposed on the second III-V compound layer, the source electrode and the drain electrode defining a channel region that has a plurality of channels of charge carriers in the first III-V compound layer,
   wherein the source electrode, the drain electrode and the gate electrode are disposed on a topmost surface of the second III-V compound layer, a normal direction of the prism plane defines an m-axis, and each of the channels of the charge carriers extends along a single direction that is parallel with the m-axis.

2. The semiconductor device according to claim 1, wherein the substrate is a semiconductor substrate, a semiconductor-on-insulator substrate, a glass substrate or a ceramic substrate.

3. The semiconductor device according to claim 1, wherein the substrate comprises:
   a core;
   a barrier layer encapsulating the core;
   a bonding layer disposed on the barrier layer; and
   a single crystalline layer disposed on the bonding layer.

4. The semiconductor device according to claim 1, wherein the m-axis is one of [10-10], [-1010], [1-100], [-1100], [01-10] and [0-110].

5. The semiconductor device according to claim 1, wherein the source electrode and the drain electrode are opposite each other, and a projection of a side wall of the source electrode facing the drain electrode on the substrate is perpendicular to the m-axis.

6. The semiconductor device according to claim 1, wherein the source electrode and the drain electrode are separated from each other in a direction of the m-axis.

7. A semiconductor device, comprising:
   a substrate;
   a first III-V compound layer disposed on the substrate, the first III-V compound layer comprising a plurality of crystal lattices, wherein each of the crystal lattices has an m-plane;
   a second III-V compound layer disposed on the first III-V compound layer; and
   a source electrode, a drain electrode and a gate electrode disposed on the second III-V compound layer, the source electrode and the drain electrode defining a channel region that has a plurality of channels of charge carriers in the first III-V compound layer, wherein the source electrode, the drain electrode and the gate electrode are disposed on a topmost surface of the second III-V compound layer, and each of the channels of the charge carriers extends along a single direction that is parallel with a normal direction of the m-plane.

8. The semiconductor device according to claim 7, wherein the substrate is a semiconductor substrate, a semiconductor-on-insulator substrate, a glass substrate or a ceramic substrate.

9. The semiconductor device according to claim 7, wherein the substrate comprises:
   a core;
   a barrier layer encapsulating the core;
   a bonding layer disposed on the barrier layer; and
   a single crystalline layer disposed on the bonding layer.

10. The semiconductor device according to claim 7, wherein the m-plane is one of plane (10-10), plane (−1010), plane (1-100), plane (−1100), plane (01-10) and plane (0-110).

11. The semiconductor device according to claim 7, wherein the source electrode and the drain electrode are opposite each other, and a projection of a side wall of the source electrode facing the drain electrode on the substrate is perpendicular to the normal direction of the m-plane.

12. The semiconductor device according to claim 7, wherein the source electrode and the drain electrode are separated from each other in the normal direction of the m-plane.

13. A manufacturing method of a semiconductor device, comprising:
   forming and providing a substrate;
   forming a first III-V compound layer on the substrate, wherein the first III-V compound layer comprises a plurality of crystal lattices, and each of the crystal lattices has a prism plane;
   forming a second III-V compound layer on the first III-V compound layer; and
   forming a source electrode, a drain electrode and a gate electrode on the second III-V compound layer, wherein the source electrode and the drain electrode define a channel region that has a plurality of channels of charge carriers in the first III-V compound layer;
   wherein the source electrode, the drain electrode and the gate electrode are disposed on a topmost surface of the second III-V compound layer, a normal direction of the prism plane defines an m-axis, and each of the channels of the charge carriers extends along a single direction that is parallel with the m-axis.

14. The manufacturing method of the semiconductor device according to claim 13, wherein the substrate is a semiconductor substrate, a semiconductor-on-insulator substrate, a glass substrate or a ceramic substrate.

15. The manufacturing method of the semiconductor device according to claim 13, wherein the substrate comprises:
   a core;
   a barrier layer encapsulating the core;
   a bonding layer disposed on the barrier layer; and
   a single crystalline layer disposed on the bonding layer.

16. The manufacturing method of the semiconductor device according to claim 13, wherein the m-axis is one of [10-10], [−1010], [1-100], [−1100], [01-10] and [0-110].

17. The manufacturing method of the semiconductor device according to claim 13, wherein the source electrode and the drain electrode are opposite each other, and a projection of a side wall of the source electrode facing the drain electrode on the substrate is perpendicular to the m-axis.

18. The manufacturing method of the semiconductor device according to claim 13, wherein the source electrode and the drain electrode are separated from each other in a direction of the m-axis.

* * * * *